(12) United States Patent
Ptasinski et al.

(10) Patent No.: US 6,957,091 B1
(45) Date of Patent: Oct. 18, 2005

(54) PORTABLE MULTI-BAND COMMUNICATION DEVICE, AND A METHOD FOR DETERMINING A CHARGE CONSUMPTION THEREOF

(75) Inventors: Kristoffer Ptasinski, Lund (SE); Charles Forsberg, Skurup (SE); Ulrika Sallenhag, Lund (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 09/490,116

(22) Filed: Jan. 24, 2000

(30) Foreign Application Priority Data

Jan. 27, 1999 (SE) .................................... 9900270
Jul. 8, 1999 (SE) .................................... 9902625

(51) Int. Cl.[7] ................................................ H04B 1/38
(52) U.S. Cl. ........................ 455/572; 455/573; 455/566
(58) Field of Search ................................ 455/574, 572, 455/573, 343, 127, 67.1, 423, 425; 379/433.68; 320/114, 166, 165, 162–164, 149, 134–136

(56) References Cited

U.S. PATENT DOCUMENTS

| | | | |
|---|---|---|---|
| 4,912,416 A * | 3/1990 | Champlin | 324/430 |
| 4,914,393 A | 4/1990 | Yoshido | |
| 5,248,929 A | 9/1993 | Burke | |
| 5,372,898 A * | 12/1994 | Atwater et al. | 429/90 |
| 5,455,499 A | 10/1995 | Uskali et al. | |
| 5,613,229 A * | 3/1997 | Baranowski et al. | 455/127 |
| 5,717,312 A * | 2/1998 | Maeda et al. | 320/162 |
| 5,821,756 A * | 10/1998 | McShane et al. | 324/430 |
| 5,838,140 A * | 11/1998 | Rosenthal | 320/133 |
| 6,140,928 A * | 10/2000 | Shibuya et al. | 340/636.13 |
| 6,430,402 B1 * | 8/2002 | Agahi-Kesheh | 455/115.3 |
| 6,522,361 B2 * | 2/2003 | Higuchi et al. | 348/372 |

* cited by examiner

Primary Examiner—Temica Beamer
(74) Attorney, Agent, or Firm—Nixon & Vanderhye P.C.

(57) ABSTRACT

A portable multi-band communication device has a power amplifier, a battery for supplying power to the power amplifier, and a controller, which controls an output power level of the communication device by generating a digital control signal for the power amplifier. The controller monitors the digital control signal and in response determines a consumption of electric energy from the battery.

17 Claims, 6 Drawing Sheets

(1st embodiment)

(1st embodiment)

(1st embodiment)

(1st embodiment)

*(2nd embodiment)*

*(2nd embodiment)*

*(2nd embodiment)*

*(3rd embodiment)*

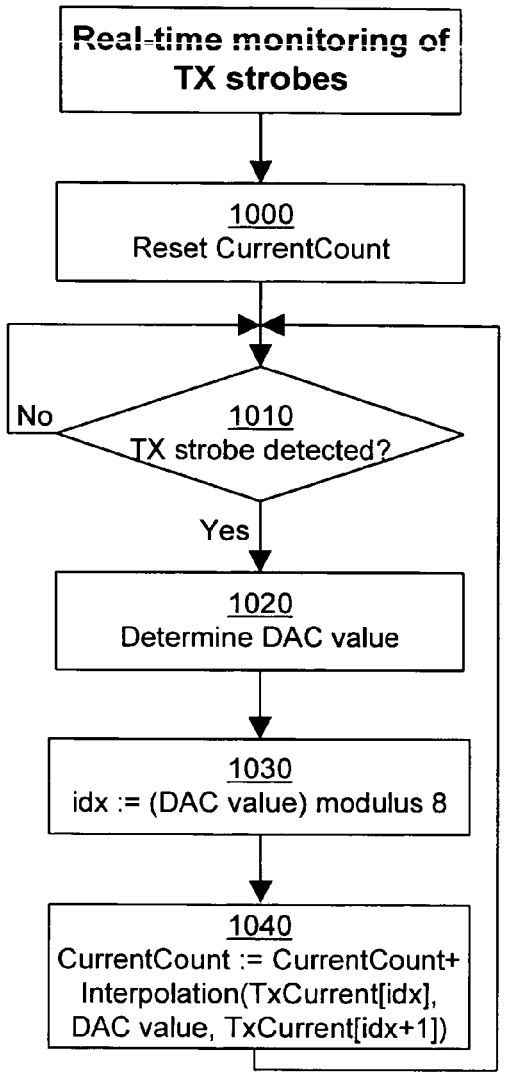
FIG 10
(3rd embodiment)
FIG 11
(3rd embodiment)
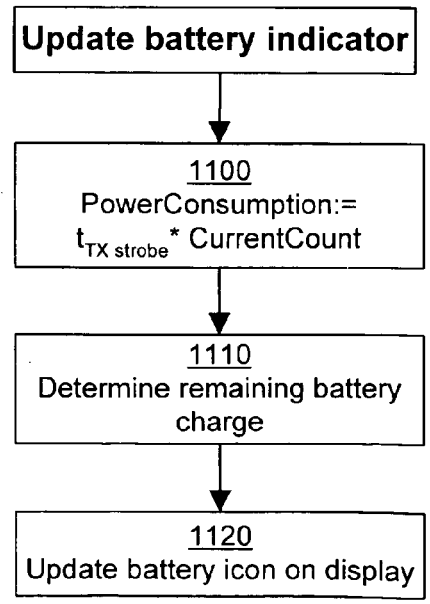

PORTABLE MULTI-BAND COMMUNICATION DEVICE, AND A METHOD FOR DETERMINING A CHARGE CONSUMPTION THEREOF

TECHNICAL FIELD

The present invention relates to portable multi-band communication devices having a power amplifier, a battery for supplying power to the power amplifier, and a controller which is arranged to control an output power level of the communication device by generating a digital control signal for the power amplifier. More specifically, the invention is directed at providing portable multi-band communication devices with improved functionality for charge consumption determination to be used for estimating remaining battery capacity. The invention also relates to a method for such charge consumption determination.

BACKGROUND

Users of portable battery-powered communication devices are dependent of a fully functional device. More specifically, the users need to know exactly for how long their devices will remain functional, until the electric energy stored in the battery has been consumed and the battery has to be recharged. This is particularly true for users of mobile telephones. Hence, for the rest of this document a mobile telephone is used, in a non-limiting sense, for exemplifying the inventive portable communication device and method.

In order to determine a precise estimation of the remaining operational time of the mobile telephone, the user needs an accurate and well-functioning battery capacity indicator or "fuel gauge". FIG. 1 illustrates a schematic mobile telephone 1 having a display 6, on which an icon 13 is presented as a battery capacity indicator. As shown in FIG. 1, the battery icon 13 indicates that approximately 25% remains of the initial battery charge. The mobile telephone 1 may have further display facilities for determining and indicating an estimated remaining time of operation, i.e. an estimation of the time left until the battery will have to be recharged.

Determining the remaining battery capacity basically includes two separate current measurements; one measurement for the current flowing into the battery (charging) and one measurement for the current consumed from the battery (discharging).

The charging current is often relatively easy to measure. A microprocessor (CPU) may read an A/D-converted signal, which is directly proportional to the current flowing through a small resistor. Since the microprocessor controls the charging process, it will also have access to all relevant data for calculating the total currents that has been supplied to the battery during a certain period of time.

Measuring the discharge current or current consumption, on the other hand, is much more difficult, particularly for advanced telephones with complex functionality and many operating modes. Traditionally, discharge current is measured by calculating the expected current consumption when the telephone is in different operating modes. Earlier mobile telephones basically had two operating modes only: talk mode and standby mode. For such mobile telephones, the current consumption in talk mode and standby mode, respectively, was measured once in a test laboratory environment and stored in memory in the telephone as a respective predetermined consumption value. In operation, the telephone would keep track of the time spent in talk mode and in standby mode, respectively, and subsequently calculate the total amount of current consumed from the battery by multiplying the respective operational times with the predetermined consumption values.

Such an approach is disclosed in U.S. Pat. No. 5,248,929, wherein a microprocessor in the mobile telephone regularly executes an interrupt-driven software routine (once every 100 ms), during which the momentary operational mode is determined. The predetermined consumption values are read from memory, and the resulting charge consumption value is added to an accumulated value, which in turn is used for determining remaining battery capacity and operational time in talk mode and standby mode.

Although providing an acceptable charge consumption estimation for a simplified scenario with only two operating modes, the approach described above has not proven applicable to more advanced telephones having a plurality of operational modes. For instance, the charge consumption of a contemporary TDMA ("Time Division Multiple Access") telephone does not only depend on whether the telephone is in standby mode or talk mode; the charge consumption is affected by at least the following conditions in standby mode and talk mode, respectively:

Standby mode
Number of neighboring base stations
Paging frequency
Backlight
LCD icon mode on/off
Location update frequency
Top indicator
Accessory connected/disconnected
Talk mode
Output power
Backlight
Band (900/1800/1900 MHz)
HR/FR/EFR (Half Rate/Full Rate/Enhanced Full_Rate), i.e. speech encoder mode
HF algorithm
DTX/no DTX (Discontinuous Transmission)
DRX/no DRX (Discontinuous Reception)
Accessory connected/disconnected Of the above, the output power in talk mode has a major influence on the battery charge consumption. For a telephone which operates in more than one frequency band, i.e. a multi-band telephone, the output power is different for different frequency bands. In view of these other parameters which will affect the charge consumption, a multi-band telephone will have a very large number of different operating modes. Previous approaches fail to provide accurate and still efficient charge consumption determination, and consequently there is an urgent need for an alternative way of determining battery charge consumption for a multi-band telephone.

SUMMARY

The present invention provides a new and substantially improved way of determining battery charge consumption for a portable multi-band communication device, such as a mobile telephone.

The problem that a multi-band communication device inherently has a very large number of different operating modes, thereby making conventional charge consumption estimation both complex and inaccurate, can be avoided by making use of an already existing power amplifier control facility. More specifically, whenever voice or data is to be transmitted from a multi-band telephone, the transmission has to be carried out at correct output power level, which—as described above—depends on the frequency band used. Correct output power is obtained by a controller by regulating an analog control signal to the power amplifier module. To this end, the controller calculates a proper digital (e.g. hexadecimal) value (DAC value), which is converted by a D/A (digital-to-analog) converter into the analog control signal to the power amplifier.

Since the power amplifier consumes a major part of the total current drawn from the battery in talk mode, the charge consumption of the power amplifier may be accurately predetermined for different DAC values, preferably by way of measurements in a test laboratory environment, before the telephone is initially used. These predetermined charge consumption values are associated with a respective DAC value and prestored in a memory of the telephone.

These prestored charge consumption values are used by the controller for keeping a record of an accumulated charge consumption value between subsequent battery chargings. This is possible since the controller is also responsible for generating the DAC values whenever a transmission is to take place. Therefore, the controller will always have access to the momentary DAC value and may read a corresponding prestored charge consumption value to be added to the accumulated value.

The invention is particularly well adapted for telephones, like a TDMA telephone, which uses different control pulses or "strobes" for switching on and off different radio circuits, e.g. power amplifier, filters and synthesizer, as well as other electronic circuits, e.g. A/D converters. In a TDMA phone, the strobes are all completely controlled by the microprocessor in such a way that the telephone may send and receive in the correct timeslot.

Other objects, features, and advantages of the present invention will appear from the following detailed disclosure, from the attached drawings as well as from the dependent claims.

BRIEF DESCRIPTION OF THE DRAWINGS

A preferred embodiment of the present invention will now be described in more detail, reference being made to the accompanying drawings, in which:

FIGS. 6–8 illustrate a second embodiment of the present invention and FIGS. 9–11 illustrate a third embodiment of the invention.

DETAILED DISCLOSURE OF EXAMPLE, NON-LIMITING EMBODIMENTS

Figure 1:
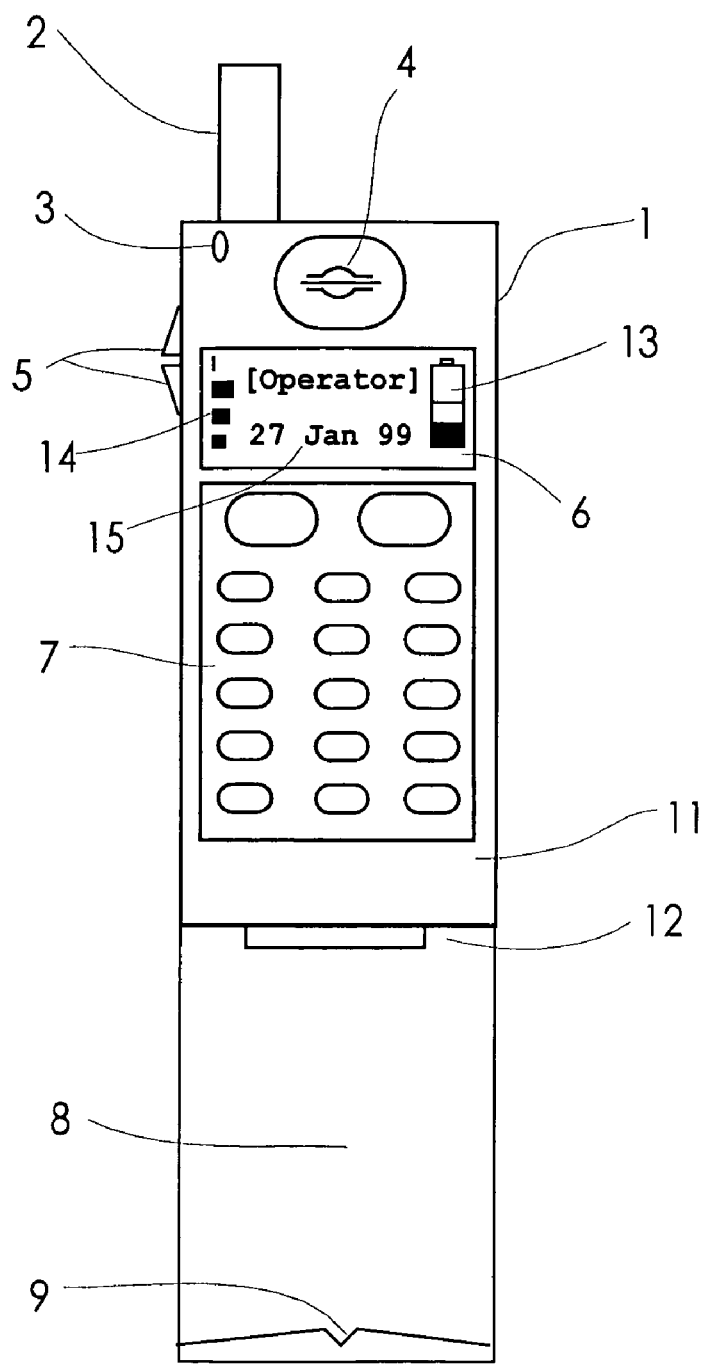
FIG. 1 is a schematic front view of a mobile telephone having a graphical indicator for remaining battery capacity.

Some example non-limiting embodiments of the present invention will now be described in detail by referring to an example mobile telephone 1 shown in FIG. 1. However, as already mentioned, the present invention is equally applicable to all other portable communication devices which fall under the definitions in the independent claims.

The mobile telephone 1 in this example is a cellular GSM TDMA telephone and comprises an antenna 2, a top indicator 3 for indicating operational status, a speaker 4, volume adjustment buttons 5, a graphical display 6, a set of keys in a keypad 7 and a flip 8, which is pivotally mounted to a telephone housing 11 by means of a hinge 12. The flip 8 has a speech opening 9 for receiving vocal acoustic energy from the user of the telephone. The acoustic energy is transmitted through the flip 8, via an internal sound guiding channel not shown in the drawing, to an internal microphone (not shown) in the telephone housing 11.

The display 6 comprises a signal strength indicator 14, a telephone operator indicator, a date indicator 15 and a remaining battery capacity indicator 13.

Figure 2:
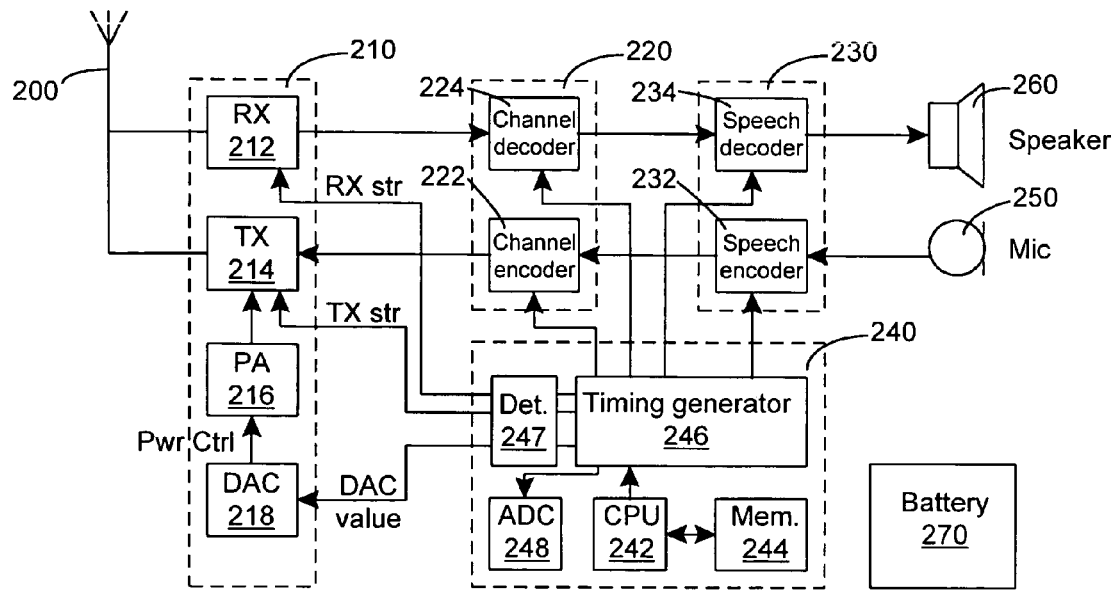
FIG. 2 is a schematic block diagram of the principal electronic and electric components of the mobile telephone shown in FIG. 1, FIG. 3 schematically illustrates a hardware implementation according to the first embodiment.

The principal electronic circuitry of the mobile telephone is illustrated in FIG. 2. From an overall point of view, the circuitry comprises an antenna 200, a radio block 210, a channel encoding/decoding block 220, a speech encoding/decoding block 230, a control block 240, a microphone 250, a speaker 260 and a battery 270. Except for the control block 240, all blocks 200, 210, 220, 230, 250, 260 and 270 have a design and structure, which are well-known and typical for a TDMA telephone commonly available on the market. Therefore, these blocks are only given a brief description below; the detailed architecture thereof is well-known to the skilled person.

The speech encoding/decoding block 230 comprises a speech encoder 232, an input of which is connected to an output of the microphone 250 and an output of which is connected to an input of a channel encoder 222 in block 220. An output of the channel encoder 222 is connected to an input of a transmitter 214, which is part of the radio block 210. An output of the transmitter 214 is connected to the antenna 200. Hence, in a well-known way the microphone 250 receives a spoken audible input from a user and converts it into a corresponding electric signal, which is supplied to the speech encoder 232. The speech encoder 232 applies either HR, FR or EFR speech encoding to the signal and supplies the result to the channel encoder 222, which performs channel encoding according to GSM TDMA standard. The output of the channel encoder 222 is fed to the transmitter 214, which comprises various electronic circuits, such as amplifiers, filters and mixers. A power amplifier 216 controls the output power level of the transmitter 214. In turn, the power amplifier 216 is controlled by an analog control signal Pwr Ctrl, which is supplied by the control block 240 as a digital signal (DAC value) and is converted into the analog Pwr Ctrl signal by a D/A (Digital-to-Analog) converter 218, as will be described in more detail below. The output of the transmitter 214 is a high-frequency TDMA signal in any available frequency band (such as 900 or 1800 MHz), and this signal is supplied to the antenna 200 and emitted into open air as electromagnetic waves propagating from the antenna 200.

Correspondingly, an incoming TDMA signal is received at the antenna 200 and processed by a receiver 212 in the radio block 210. Basically, the operation of the receiver 212 is the inverse of that of the transmitter 212. An output of the receiver 212 is decoded in a channel decoder 224 in block 220 and is furthermore decoded by a speech decoder 234 in block 230. The output thereof is supplied to the speaker 260, which converts the electric signal into acoustic soundwaves to be emitted to the user.

The battery 270 is arranged to supply power to the various electronic circuits in modules 210, 220, 230 and 240. Preferably, the battery 270 is any commercially available rechargeable battery, such as a Li-ion, NiML or NiCd battery.

The control block 240 comprises a microprocessor or CPU (Central Processing Unit) 242, which is bidirectionally connected to a memory 244. Among other functions, the CPU 242 controls the various components in blocks 210, 220 and 230, as well as an A/D converter 248, by means of control signals indicated as unidirectional arrows in FIG. 2. More specifically, the components of the radio block 210, which consumes a majority of the total electric energy consumed from the battery 270, are controlled by the CPU 242 and an associated timing generator 246 by means of respective pulsed control signals or "strobes". Consequently, a "TX str" strobe is supplied by timing generator 246, under control from CPU 242, to the transmitter 214. Similarly, an "RX str" strobe controls the receiver 212. A separate strobe controls the A/D converter 248.

Up to this point, the architecture of the control block 240 as well as the operation thereof by way of different strobes are essentially identical to a standard GSM TDMA telephone.

According to the first embodiment, the control block 240 is provided with a strobe detector 247, which is arranged to detect the occurrence of strobes (i.e. control pulses having the purpose of switching specific circuits on and off) submitted by the timing generator 246 on individual control lines, which extend between the timing generator 246 and the transmitter 214 and receiver 212, respectively, of the radio block 210. Simultaneously, the strobe detector 247 is arranged to read a momentary value of the digital control signal (DAC value) supplied to the D/A converter 218 for controlling the output power level of the power amplifier 216. Additionally, the strobe detector 247 is arranged to count the number of TX strobes that have been generated for different output power levels (different DAC values). As will be described in more detail below, these will be used by the CPU 242 to determine a consumption of charge from the battery 270.

Before providing a detailed description of the functions of the strobe detector 247 and the CPU 242 for determining aforesaid charge consumption value, the inventive concept of using control signals or strobes for the purpose of determining charge consumption will be discussed next.

As already mentioned, a TDMA telephone uses a number of control pulses or strobes, which are used to switch on and off i.e. various radio circuits. The strobes are controlled by the CPU 242 in such a way, that the telephone is capable of sending and receiving in the correct TDMA timeslot. For instance, the TX strobe is activated at least once for each TDMA frame in order to switch on transmitter 214 and the components associated therewith, such as the power amplifier 216. The transmitter is activated by the TX strobe just before the correct timeslot and is then deactivated immediately after this timeslot by switching the TX strobe from e.g. a high logical value to a low logical value. In normal talk mode, i.e. for a voice call, the TX strobe is generated once in every TDMA frame by the CPU 242 and the timing generator 246 for as long as the ongoing telephone call lasts. In case of a data call, on the other hand, the number of TX strobes may be two or more (multislot) in each TDMA frame. Simultaneously, as described above, the CPU 242 determines a certain digital (hexadecimal) value of the digital control signal DAC value, which is converted into the analog control signal Pwr Ctrl used for regulating the power amplifier 216 in order to obtain a correct output power level of the transmitter 214.

Now, since the TX strobe activates/deactivates a well-defined set of electronic circuits in the transmitter 214 and the power amplifier 216, and since the individual charge consumption of each of these circuits is well-known and/or may be accurately measured with respect to all possible DAC values in a test laboratory environment, the different DAC values are associated with respective predetermined specific current consumption values representing the current consumed by all relevant transmitter and power amplifier circuits upon activation by one TX strobe.

By keeping track of the number of times that the TX strobe has occurred for different DAC values, the total current consumption caused by TX strobes during a given period of time may easily be calculated by multiplying the results of the count with the predetermined current consumption values per TX strobe.

As an important advantage, the inventive scheme described above works independent of whether the telephone has been used for a voice call (involving exactly one TX strobe per TDMA frame) or a data call (multislot possibly involving more than one TX strobe per TDMA frame). The detector 247 simply keeps track of all TX strobes irrespective of in what frames they may appear.

In addition to the above the RX strobe and other strobes may also be monitored, such as an A/D strobe for controlling the A/D converter 248.

Figure 3:
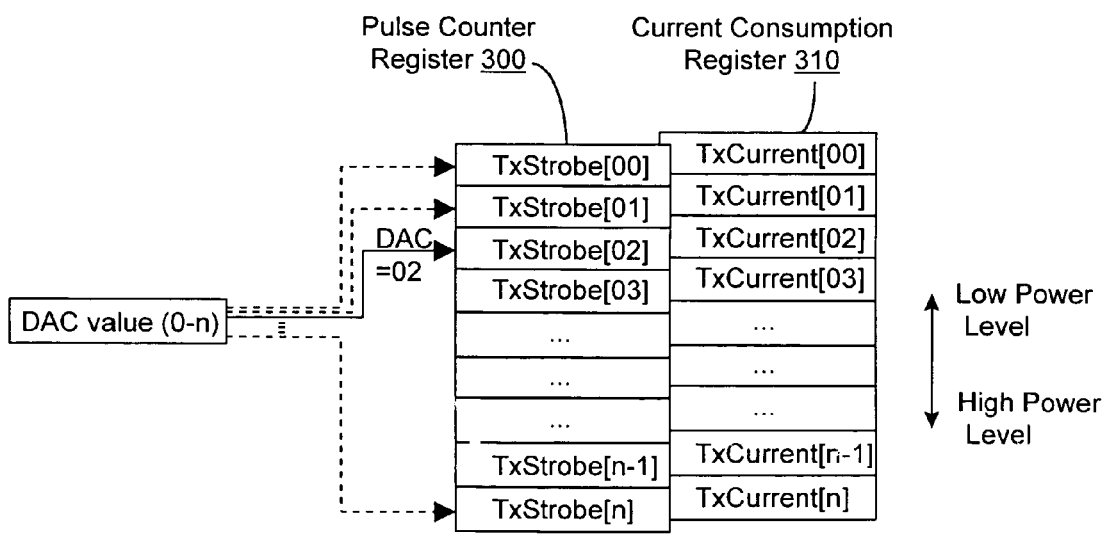

Returning to the detailed description of the first embodiment, the strobe detector 247 comprises a pulse counter register 300 shown in FIG. 3. Since the current consumption during a TX strobe depends on the momentary power level of the transmission (as set by DAC value), the pulse counter register 300 comprises a plurality, or n+1, of memory cells TxStrobe[00], TxStrobe[01], TX strobe[02], . . . TxStrobe[n]. Each memory cell corresponds to a respective DAC value.

Initially, all memory cells are cleared, i.e. set to 0. Then, each time a TX strobe is generated by the timing generator 246, the strobe detector 247 will increase the memory contents at memory cell TxStrobe[i], where i corresponds to the momentary transmission power level as set by DAC value.

As already mentioned, a current consumption value is associated with each memory cell in the pulse counter register 300. These current consumption values, which represent the respective amount of current consumed by relevant electronic circuits upon activation by the TX strobe for a particular DAC value, are stored in a current consumption register 310. In similarity with the pulse counter register 300, the current consumption register 310 may be located within the strobe detector 247, preferably implemented as an EEPROM memory, or alternatively the register may be stored in the conventional memory 244.

Figure 4:
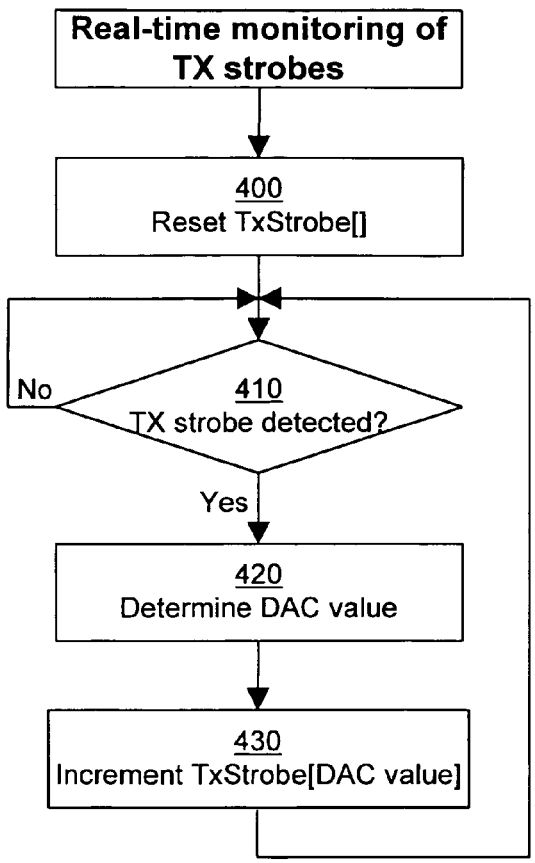
FIGS. 4 and 5 are flow charts illustrating a software implementation according to the first embodiment.

FIG. 4 illustrates an algorithm for real-time monitoring of TX strobes according to the first embodiment. In this embodiment, the algorithm is executed by the strobe detector 247. Upon initialization, all memory cells TX strobe[ ] are cleared (set to 0) in a first step 400. Next, a loop comprising steps 410, 420 and 430 is continuously executed. A step 410 monitors whether a TX strobe has been detected. If no such strobe is detected, the control is immediately transferred back to the beginning of step 410. On the other hand, if the answer is in the affirmative, a momentary DAC value is determined in a step 420. Then, in step 430, the contents of the memory cell TxStrobe [DAC value] is incremented. After that, the control is transferred back to the beginning of step 410, thereby forming an endless loop. In this way, the control block 240 continuously monitors the occurrence of TX strobes and reads the associated momentary DAC values so as to keep track of the momentary current consumption caused thereby.

Figure 5:
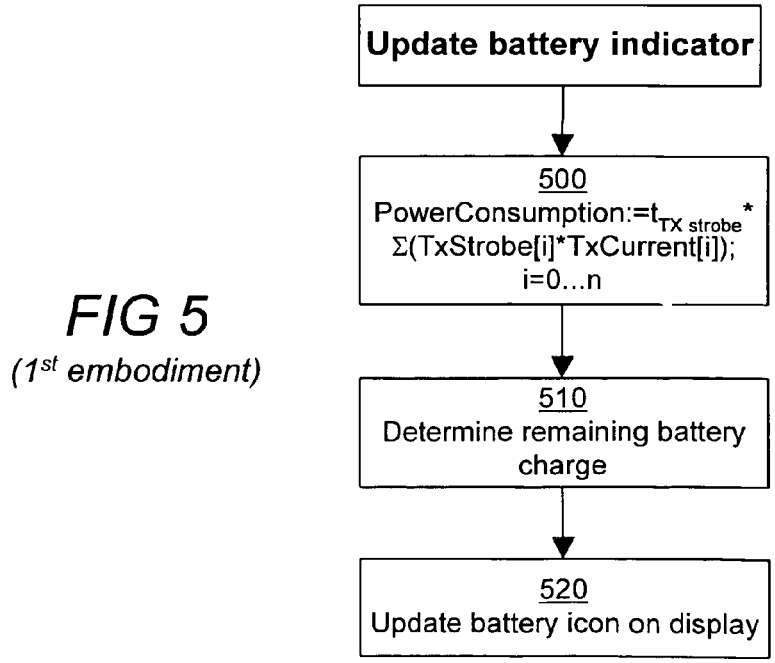

FIG. 5 illustrates an algorithm executed by the control block 240 in order to determine an accumulated charge consumption value and use this for determining the remaining battery charge. As shown in step 500, an accumulated current consumption value is calculated by multiplying all memory cells TxStrobe[00 . . . n] in the pulse counter register 300 with the corresponding memory cells TxCurrent [00 . . . n] of the current consumption register 310. By summing the results of these multiplications and finally multiplying with a predetermined duration $t_{TxStrobe}$ of a transmit burst, a total accumulated charge consumption value is obtained in step 500. This value is used in step 510 for determining the remaining battery charge, preferably by subtracting the accumulated charge consumption value obtained in step 500 with a previous value of remaining battery capacity. Subsequently, in step 520, the battery icon 13 is updated on the display 6 to reflect the updated remaining battery charge estimation.

Figure 6:
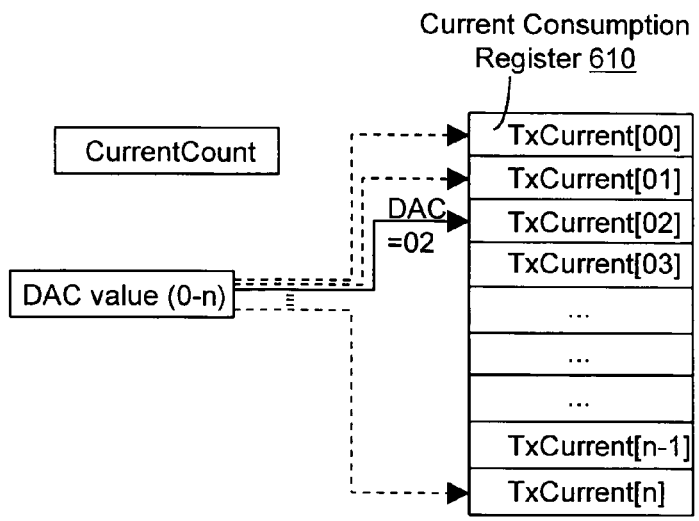
Figure 7:
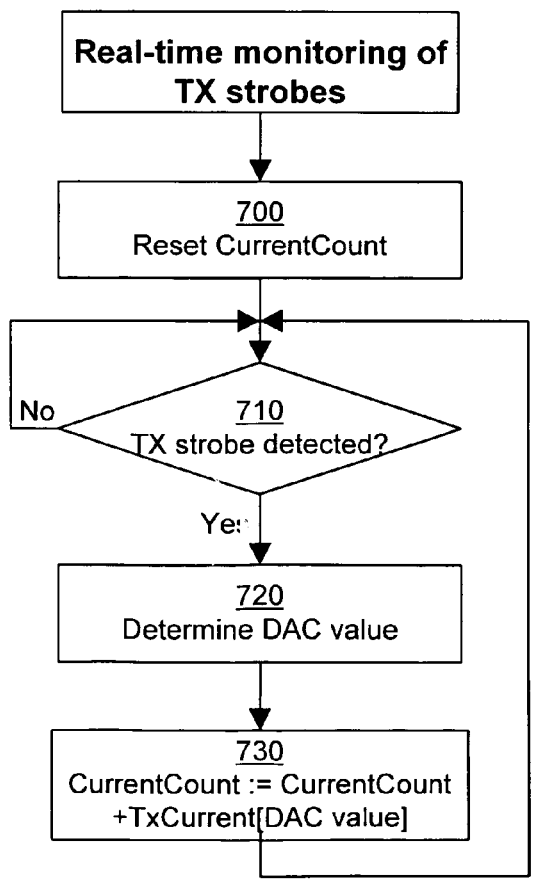
Figure 8:
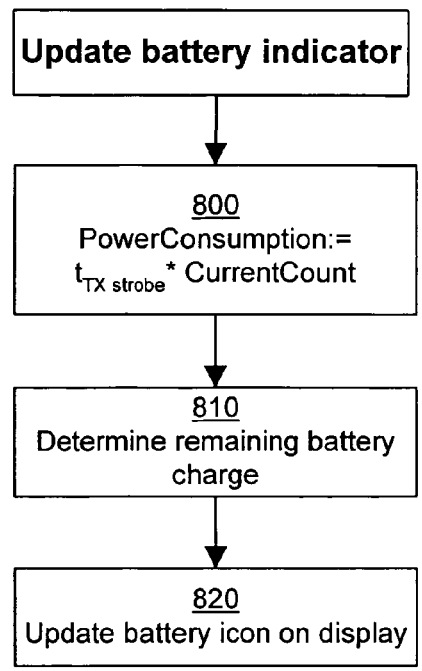

A second example embodiment is illustrated in FIGS. 6–8. As shown in FIG. 6, the second example embodiment uses a single counter only (Current Count) instead of a table of counters, thereby saving memory. A current consumption register 610, holding predetermined current consumption values, is still used.

An algorithm for real-time monitoring of TX strobes according to the second example embodiment is shown in FIG. 7. The current counter is reset or initialized in step 700. In a step 710, it is monitored whether a TX strobe has been detected. If the answer is in the affirmative, the control is transferred to step 720, where the momentary DAC value is determined. In step 730 the current counter is incremented by the contents of the memory cell TxCurrent[DAC value] of current consumption register 610, in accordance with the momentary DAC value determined in step 720. On completion of step 730, the control is transferred back to the beginning of step 710.

FIG. 8 illustrates an algorithm for updating the battery indicator according to the second example embodiment. In step 800, an accumulated charge consumption value is simply calculated by multiplying the transmit burst duration $t_{TxStrobe}$ with the value of the current counter. In subsequent steps 810 and 820, the remaining battery charge is determined, and the battery icon 13 is updated on the display 6, in similarity with steps 510 and 520 of FIG. 5. Compared to the first embodiment, the second embodiment represented by FIGS. 6–8 is more memory-efficient and also avoids multiplication by complete registers, thereby saving CPU power efficiency.

Figure 9:
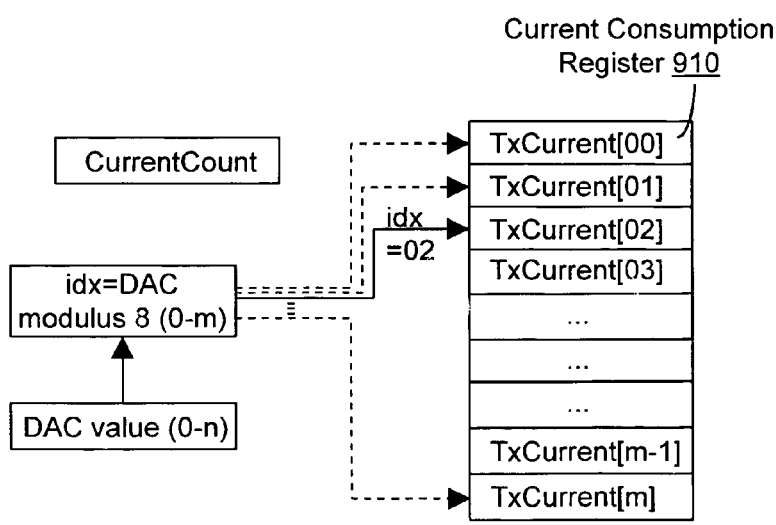

A third example embodiment of the invention is shown in FIGS. 9–11. For the third embodiment, the memory efficiency has been further improved. The size of the current consumption register 910 has been reduced as compared to the first and second embodiments. This will cause essentially no, or at least very little, loss in accuracy by using interpolation to obtain a correct current consumption value. In similarity with the second embodiment, the third embodiment uses one single current counter, but the current consumption register 910 has been reduced in size by only storing a current consumption value for every eighth DAC value. The current consumption register 910 is indexed by calculating idx-DAC value modulus 8. Two adjacent memory cells TxCurrent[idx] and TxCurrent[idx+1] are read, and these values are used for interpolating a correct current consumption value, as shown in the flow chart of FIG. 10.

Steps 1000, 1010 and 1020 of FIG. 10 are essentially identical to the corresponding steps of FIGS. 4 and 7. In step 1030, as already mentioned, the index value idx is calculated as DAC value modulus 8. Then, in step 1040, a momentary current consumption value is obtained by linear interpolation between the values TxCurrent[idx] and TxCurrent [idx+1], and the result thereof is added to the current counter. Subsequently, the control is transferred back to the beginning of step 1010.

The algorithm shown in FIG. 11 for updating the battery indicator is essentially identical to the corresponding algorithms shown in FIGS. 5 and 8 for the first and second embodiments, respectively.

According to yet another example embodiment, the current consumption registers of the first, second, and third example embodiments may be replaced by a polynomial, which describes current consumption as a function of DAC value, for further improved memory efficiency.

The procedures above, which have been described in relation to the TX strobe, may be extended to other strobes and circuits, such as the A/D converter 248, the channel encoder 222, the channel decoder 224, the speech encoder 232 and the speech decoder 234. The TX strobes described above all have a fix length in time and may consequently alternatively be stored directly in the form of charge consumption values (expressed in mAh). However, for strobes that are variable in length, the predetermined consumption values may be stored as current consumption values (in mA), and the individual duration of such variable-length strobes will be determined by the CPU 242 or the strobe detector 247. For instance, such a variable strobe length may be determined by adding a signal with a well-known frequency in a register during the duration of the individual strobe. Upon execution of the procedures for determining total charge consumption shown in FIGS. 5, 8 and 11 the content of such a register directly represents the total time during which the particular strobe has been active. By simply multiplying this time with the associated current consumption value, the charge consumption related to the strobe may be determined. According to an alternative embodiment, a power consumption value is obtained by multiplying the calculated total charge consumption with a value of the battery terminal voltage.

The invention has been described above with reference to a few example embodiments. However, the present invention shall in no way be limited by the description above; the scope of the invention is best defined by the appended independent claims. Other embodiments than the particular ones described above are equally possible within the scope of the invention. For instance, even if according to the above embodiments the determination of the total charge consumption is determined in both hardware (strobe detector 247) and software (routine executed by the CPU 242), the scheme may be implemented solely in hardware, solely in software or partly in software and partly in hardware. Moreover, the invention is applicable also to other telephones than TDMA telephones, such as W-CDMA telephones.

What is claimed is:

1. A portable multi-band communication device, comprising:
   a controller for generating a control signal strobe,
   a radio transmitter controllable using the control signal strobe,
   a power amplifier operatively connected to the radio transmitter, and
   a battery for supplying power to the power amplifier,
   wherein the controller is arranged to:
      control an output power level of the communication device by generating a digital control signal for the power amplifier,
      monitor the digital control signal, and determine a specific amount of electric energy consumed from the battery based on the monitored digital control signal and the detected control signal strobe.

2. A portable multi-band communication device as in claim 1, further comprising:
a (digital-to-analog) (D/A) converter operatively connected to the power amplifier and arranged to receive, as an input, the digital control signal, convert the digital control signal into an analog control signal, and provide the analog control signal to the power amplifier.

3. A portable multi-band communication device as in claim 1, further comprising:
a memory operatively connected to the controller is adapted to store a set of predetermined consumption values associated with different values of the digital control signal.

4. A portable multi-band communication device as in claim 3, further comprising:
a radio transmitter controlled through a control signal strobe submitted by the controller, wherein the controller is arranged to:
detect the control signal strobe to the radio transmitter,
determine a value of the digital control signal,
form an index from the determined value of the digital control signal,
use the index for reading one consumption value in the predetermined set from the memory, and
update an accumulated consumption value to reflect the consumption value thus read.

5. A portable multi-band communication device as in claim 3, further comprising:
a radio transmitter is controlled through a control signal strobe submitted by the controller the memory having a set of counters) for different values of the digital control signal, wherein the controller is arranged to:
detect the control signal strobe to the radio transmitter,
determine a value of the digital control signal,
increment, in said set of counters, the counter that represents the determined value of the digital control signal, and
subsequently calculate the consumption of electric energy from the battery from the contents of said set of counters and from the set of predetermined consumption values.

6. A portable multi-band communication device as in claim 3, wherein the set of predetermined consumption values is represented by a polynomial function.

7. A portable multi-band communication device as in claim 1, the device further comprising:
a graphical display, wherein the controller is arranged to calculate an estimated remaining battery capacity by subtracting the determined consumption of electric energy from a previous value of remaining battery capacity, and wherein the controller is arranged to visually indicate the calculated estimated remaining battery capacity on the graphical display.

8. A portable multi-band communication device as in claim 1, wherein the device is a mobile telephone, employing TDMA, or W-CDMA.

9. A method of determining a charge consumption for a portable battery-powered communication device including a radio transmitter, a power amplifier operatively connected to the radio transmitter, and a controller operatively connected to the power amplifier, wherein an output power level of the radio transmitter is controlled by the power amplifier through a digital control signal from the controller, and wherein the radio transmitter is furthermore responsive to a control signal strobe, the method comprising:
storing a set of predetermined consumption values providing an association between different amounts of electric charge consumption and respective values of the digital control signal,
detecting the control signal strobe,
determining a value of the digital control signal,
selecting, from said set of predetermined consumption values, a value which corresponds to the determined value of the digital control signal, and
updating an accumulated charge consumption value to reflect the selected value.

10. A method according to claim 9, applied to a mobile telephone.

11. A portable multi-band communication device according to claim 2, wherein the controller is arranged to:
keep track of the number of times that the control signal strobe has occurred for different values of the digital control signal, and
determine the total amount of electric energy consumed caused by control signal strobes during a given period of time.

12. A portable multi-band communication device comprising:
a power amplifier controlled by a digital control signal;
a battery for supplying power to the power amplifier;
a memory for storing an association between different power consumption values and respective digital control signal values; and
a controller arranged to:
control an output power level of the communication device by generating the digital control signal;
monitor the digital control signal for the power amplifier; and
determine an amount of electrical energy remaining in the battery based on at least one power consumption value stored in the memory, said at least one power consumption value being associated with a value of the monitored digital control signal.

13. A portable multi-band communication device as in claim 12, further comprising:
a digital-to-analog converter operatively connected to the power amplifier and arranged to receive as an input the digital control signal, convert the digital control signal into an analog control signal, and provide the analog control signal to the power amplifier.

14. A portable multi-band communication device as in claim 12, further comprising:
a radio transmitter controlled through a control signal strobe submitted by the controller,
wherein the controller is arranged to:
detect the control signal strobe to the radio transmitter,
determine a value of the digital control signal,
form an index from the determined value of the digital control signal,
use the index for reading one consumption value stored in the memory, and
update an accumulated consumption value to reflect the consumption value read from the memory.

15. A portable multi-band communication device as in claim 12, further comprising:
a radio transmitter is controlled through a control signal strobe submitted by the controller, and
a set of counters for different values of the digital control signal, wherein the controller is arranged to:
  detect the control signal strobe to the radio transmitter,
  determine a value of the digital control signal,
  increment, in said set of counters, the counter that represents the determined value of the digital control signal, and
  subsequently calculate the consumption of electric energy from the battery from the contents of said set of counters and from the consumption values.

16. A portable multi-band communication device as in claim 12, wherein the consumption values are represented by a polynomial function.

17. A portable multi-band communication device as in claim 12, further comprising:
  a graphical display, wherein the controller is arranged to calculate an estimated remaining battery capacity by subtracting the determined consumption of electric energy from a previous value of remaining battery capacity, and wherein the controller is arranged to visually indicate the calculated estimated remaining battery capacity on the graphical display.

\* \* \* \* \*